(12) United States Patent
Chan et al.

(10) Patent No.: US 10,579,085 B2
(45) Date of Patent: Mar. 3, 2020

(54) POWER DISTRIBUTION UNIT AND FAULT DETECTING METHOD

(71) Applicant: DELTA ELECTRONICS, INC., Taoyuan (TW)

(72) Inventors: Chih-Chiang Chan, Taoyuan (TW); I-Chieh Li, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 203 days.

(21) Appl. No.: 15/218,090

(22) Filed: Jul. 25, 2016

(65) Prior Publication Data

US 2017/0160761 A1   Jun. 8, 2017

(30) Foreign Application Priority Data

Dec. 8, 2015   (TW) .............................. 104141026 A

(51) Int. Cl.
| | |
|---|---|
| *G05B 23/02* | (2006.01) |
| *G05F 1/66* | (2006.01) |
| *H02J 1/06* | (2006.01) |
| *G01R 31/40* | (2020.01) |
| *G05B 19/10* | (2006.01) |
| *H02J 1/00* | (2006.01) |

(Continued)

(52) U.S. Cl.
CPC .............. *G05F 1/66* (2013.01); *G01R 31/40* (2013.01); *G05B 19/106* (2013.01); *G05B 23/027* (2013.01); *G05B 23/0275* (2013.01); *H02J 1/00* (2013.01); *H02J 1/06* (2013.01); *G01R 27/18* (2013.01); *G01R 31/025* (2013.01); *G05B 2219/31356* (2013.01); *G05B 2219/32222* (2013.01)

(58) Field of Classification Search
None
See application file for complete search history.

(56) References Cited

U.S. PATENT DOCUMENTS 4,739,274 A * 4/1988 Kimball ................... H02H 3/17
324/520
5,774,316 A * 6/1998 McGary ................... H02H 3/17
361/101

(Continued)

FOREIGN PATENT DOCUMENTS

| CN | 103250061 A | 8/2013 |
|---|---|---|
| CN | 103323674 A | 9/2013 |

(Continued)

*Primary Examiner* — Thomas C Lee
*Assistant Examiner* — Gary Collins
(74) *Attorney, Agent, or Firm* — CKC & Partners Co., LLC

(57) ABSTRACT

A power distribution unit and a fault detecting method applied in the power distribution unit are disclosed herein. The power distribution unit includes an input terminal, an insulation fault detection circuit and a processing circuit. The input terminal is electrically coupled to a positive power line and a negative power line, and configured to receive a high voltage direct current (HVDC) voltage. The insulation fault detection circuit is configured to detect an insulation resistance value between a ground terminal and the positive power line or the negative power line. The processing circuit is configured to output a warning signal according to the insulation resistance value.

16 Claims, 5 Drawing Sheets

(51) Int. Cl.
*G01R 31/02* (2006.01)
*G01R 27/18* (2006.01)

(56) References Cited

U.S. PATENT DOCUMENTS

| | | | | |
|---|---|---|---|---|
| 6,278,596 | B1* | 8/2001 | Simpson | G01R 1/36 |
| | | | | 361/101 |
| 9,547,033 | B1* | 1/2017 | Batten | G01R 31/08 |
| 2002/0140433 | A1* | 10/2002 | Lawson | G01R 27/18 |
| | | | | 324/509 |
| 2007/0011547 | A1* | 1/2007 | Karam | G06F 1/266 |
| | | | | 714/746 |
| 2012/0119918 | A1* | 5/2012 | Williams | G01R 31/3277 |
| | | | | 340/664 |
| 2012/0235496 | A1 | 9/2012 | Krenz et al. | |
| 2013/0176041 | A1 | 7/2013 | Yang | |
| 2013/0285670 | A1* | 10/2013 | Yoshidomi | G01R 31/025 |
| | | | | 324/510 |
| 2014/0225444 | A1* | 8/2014 | Yoshidomi | H02H 3/16 |
| | | | | 307/78 |
| 2014/0347897 | A1 | 11/2014 | Broussard et al. | |

FOREIGN PATENT DOCUMENTS

| | | |
|---|---|---|
| CN | 203423377 U | 2/2014 |
| CN | 103107518 B | 9/2015 |
| JP | 08-182186 A | 7/1996 |
| JP | 2003-61239 A | 2/2003 |
| JP | 2006-84203 A | 3/2006 |
| JP | 2006084203 A | 3/2006 |
| JP | 2011-188680 A | 9/2011 |
| JP | 2013-145157 A | 7/2013 |
| JP | 2013-148401 A | 8/2013 |
| JP | 2013-537313 A | 9/2013 |
| JP | 5507297 B2 | 5/2014 |
| TW | 200906023 A | 2/2009 |
| TW | 200924341 A | 6/2009 |

* cited by examiner

POWER DISTRIBUTION UNIT AND FAULT DETECTING METHOD

RELATED APPLICATIONS

This application claims priority to Taiwan Application Serial Number 104141026, filed Dec. 8, 2015, which is herein incorporated by reference.

BACKGROUND

Technical Field

The present disclosure relates to a power distribution unit, and in particular, to a HVDC power distribution unit.

Description of Related Art

In recent times, with the rising awareness of power saving, more and more power applications adopt high-voltage direct-current power supplies to improve the power conversion efficiency and reduce the cost of the cooling system.

However, since the voltage range of the HVDC power supply system falls within the dangerous voltage defined in the safety regulation, leakage current often occurs if the grounding insulation is poor, resulting in an accident when a user contact the device housing.

Therefore, an important area of research in the field involves ways in which to improve the safety of the power devices applying HVDC power supply system and reduce the user risk of electric shock.

SUMMARY

To solve the problem stated above, one aspect of the present disclosure is a power distribution unit. The power distribution unit includes an input terminal, an insulation fault detection circuit and a processing circuit. The input terminal is electrically coupled to a positive power line and a negative power line, and configured to receive a high voltage direct current (HVDC) voltage. The insulation fault detection circuit is configured to detect an insulation resistance value between a ground terminal and the positive power line or the negative power line. The processing circuit is configured to output a warning signal according to the insulation resistance value.

Another aspect of the present disclosure is a power distribution unit. The power distribution unit includes an input terminal, at least one output branch, and a processing circuit. The input terminal is configured to receive a high voltage direct current voltage, in which the input terminal includes a positive node electrically coupled to a positive power line, and a negative node electrically coupled to a negative power line. The output branch includes an output terminal and a leakage current detecting element. The output terminal is configured to output the high voltage direct current voltage. The leakage current detecting element is configured to detect the current of the output branch and output a current detecting signal accordingly. The processing circuit is configured to output a corresponding warning signal according to the current detecting signal.

One another aspect of the present disclosure is a fault detecting method. The fault detecting method includes: detecting, by the insulation fault detection circuit, an insulation resistance value between a ground terminal and a positive power line electrically coupled to the input terminal, or between the ground terminal and a negative power line electrically coupled to the input terminal; determining whether a grounding fault occurred in the power distribution unit according to the insulation resistance value; and outputting, by the processing circuit, a warning signal when the grounding fault occurred.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
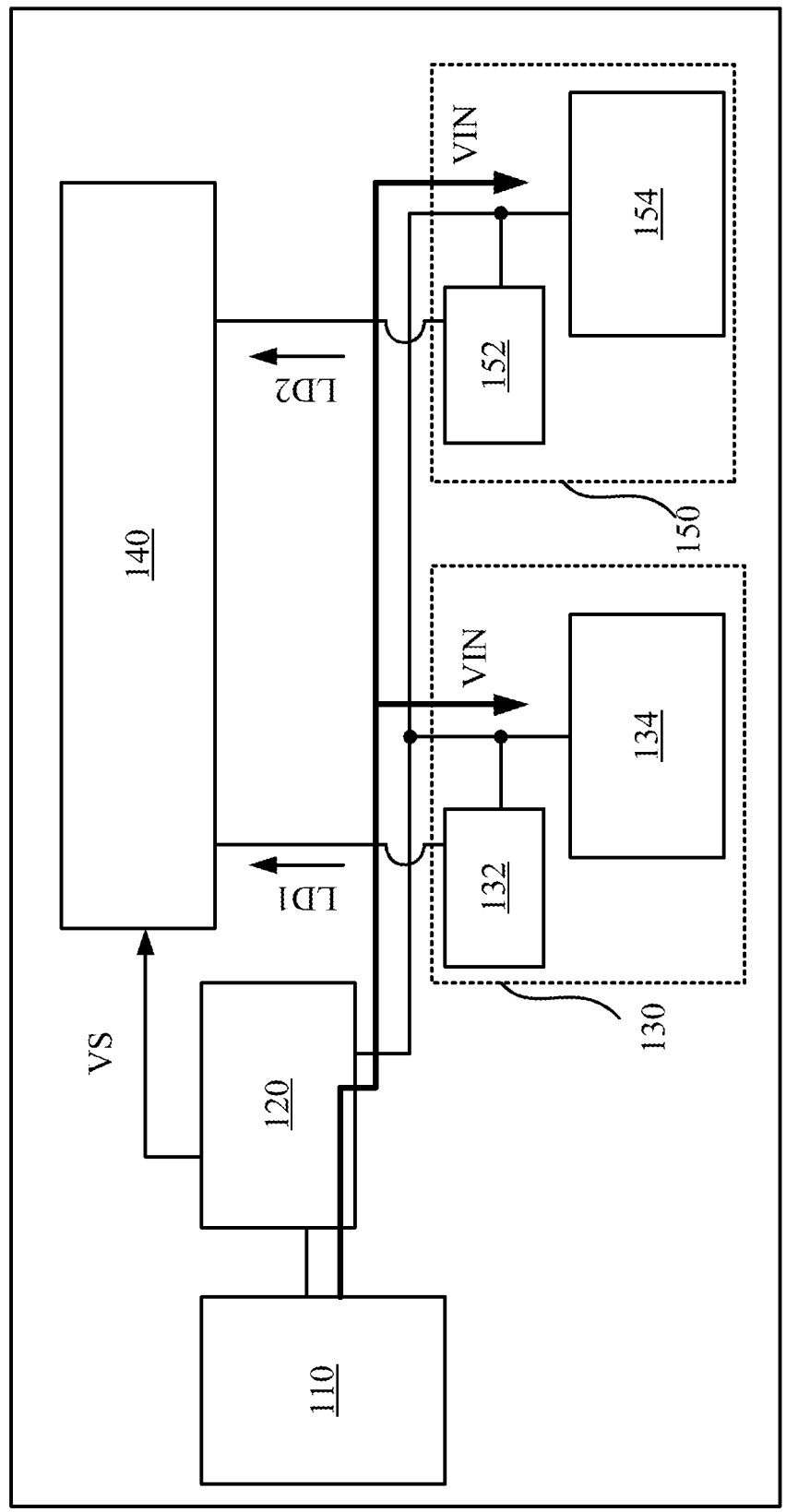
FIG. 1 is a diagram illustrating a power distribution unit according to an embodiment of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

The terms "about" and "approximately" in the disclosure are used as equivalents. Any numerals used in this disclosure with or without "about," "approximately," etc. are meant to cover any normal fluctuations appreciated by one of ordinary skill in the relevant art. In certain embodiments, the term "approximately" or "about" refers to a range of values that fall within 20%, 10%, 5%, or less in either direction (greater or less than) of the stated reference value unless otherwise stated or otherwise evident from the context.

In the following description and in the claims, the terms "include" and "comprise" are used in an open-ended fashion, and thus should be interpreted to mean "include, but not limited to." As used herein, the term "and/or" includes any and all combinations of one or more of the associated listed items.

In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Reference is made to FIG. 1. FIG. 1 is a diagram illustrating a power distribution unit 100 according to an embodiment of the present disclosure. In the embodiment shown in FIG. 1, the power distribution unit 100 includes an input terminal 110, output branches 130 and 150, an insulation fault detection circuit 120 and a processing circuit 140. In some embodiments, the power distribution unit 100 may be a high voltage direct current (HVDC) power distribution unit, and may be configured to receive a HVDC voltage VIN from the input terminal 110, and distribute the HVDC voltage VIN to output branches 130 and 150 so as to supply power for circuits and devices in latter stages. In some embodiments, HVDC voltage VIN for the high voltage direct current power supply may be HVDC voltage between 260 Volts and 400 Volts, such as approximately 380 Volts HVDC voltage.

The insulation fault detection circuit 120 is electrically coupled to the input terminal 110 and configured to detect an insulation resistance value of the power distribution unit 100 and output a voltage signal VS, which corresponds to the insulation resistance value, to the processing circuit 140.

The processing circuit 140 is electrically coupled to the insulation fault detection circuit 120 and configured to output the warning signal according to the insulation resistance value. Alternatively stated, the processing circuit 140 may determine the insulation status of the power distribution unit 100, and output the warning signal in order to notify the users and maintenance staff when the insulation resistance value is abnormal due to the abnormal situations such as grounding fault occurred. Specifically, in some embodiments, the processing circuit 140 receives the voltage signal VS outputted by the insulation fault detection circuit 120, and determines whether the insulation resistance value of the power distribution unit 100 is abnormal according to the voltage signal VS.

In some embodiments, the output branches 130 and 150 include leakage current detecting elements 132, 152 and output terminals 134, 154 respectively. The leakage current detecting elements 132 and 152 are electrically coupled to the processing circuit 140 and configured to detect the current of the output branches 130 and 150 respectively, and output the current detecting signal LD1 and LD2 to the processing circuit 140 accordingly. The output terminals 134 and 154 are configured to output HVDC voltage VIN so as to supply power to different circuits or devices in the latter stages.

Therefore, the processing circuit 140 may output the corresponding warning signal according to the current detecting signal LD1 and LD2. Specifically, when the processing circuit 140 determines, according to the voltage signal VS, that the current leakage occurred in the power distribution unit 100, the processing circuit 140 may further determines the current leakage occurred in the output branch 130 or the output branch 150 according to the current detecting signal LD1 and LD2, so as to provide corresponding warning signal.

Thus, when faults causes leakage current occurred in the power distribution unit 100, the users may receive the information immediately and therefore perform the operation and the maintenance of the power distribution unit 100 safely. For example, the warning signal outputted by the processing circuit 140 may perform control in accompanied with audio modules, lighting modules or display modules correspondingly to warn the users and the maintenance staff at the site in order to prevent the users from touching the power distribution unit 100 without protection means.

In addition, when applied to the smart power distribution unit 100 having power detecting modules and communication modules, the warning signal outputted by the processing circuit 140 may further used to notify the remote end users the failure information via communication modules, or collect the power information of the power distribution unit 100 by the power detecting modules and report the abnormal records to the remote end users by the communication modules to perform failure analysis. In some embodiments, the processing unit 140 may further choose to send the command manually by the remote end users or send the command automatically by the processing circuit 140 according to the fault level, to terminate the operation of the corresponding output branch in the power distribution unit 100, to avoid further damage caused by the leakage current.

In the following paragraphs, the detailed operation of the insulation fault detection circuit 120, the leakage current detecting elements 132 and 152 will be explained in accompany with the embodiments illustrated in the corresponding figures.

Figure 2:
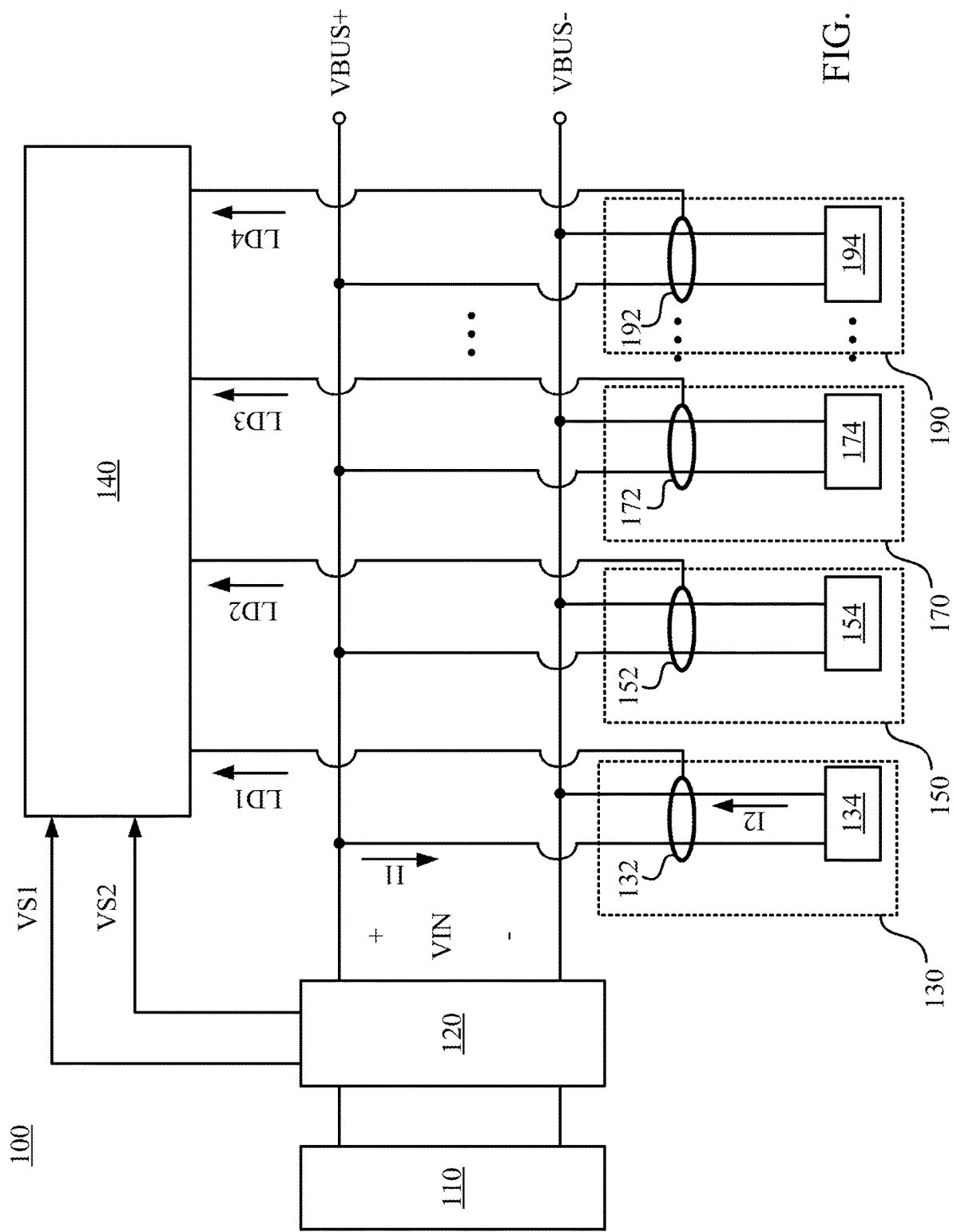
FIG. 2 is a diagram illustrating the power distribution unit according to an embodiment of the present disclosure.

Reference is made to FIG. 2. FIG. 2 is a diagram illustrating the power distribution unit 100 according to an embodiment of the present disclosure. In the embodiment illustrated in the FIG. 2, the power distribution unit 100 includes output branches 130, 150, 170, and 190. It is noted that the numbers of the output branches in the present embodiment is for exemplary purpose only and not meant to limit the present disclosure. One skilled in the art may arrange one or multiple output branches in the power distribution unit 100 according to the actual needs.

As shown in FIG. 2, the input terminal 110 includes a positive node 112 and a negative node 114. The positive node 112 and the negative node 114 are electrically coupled to the positive power line VBUS+ and the negative power line VBUS− respectively via the insulation fault detection circuit 120. For example, in some embodiments, the voltage value of the positive power line VBUS+ may be +190V, and the voltage value of the negative power line VBUS− may be 190V.

Each one of the output branches 130, 150, 170, and 190 includes leakage current detecting elements 132~192 and the output terminals 134~194 respectively. The first nodes of the output terminals 134~194 are electrically coupled to the positive power line VBUS+, and the second nodes of the output terminal 134~194 are electrically coupled to the negative power line VBUS−, such that the output terminals 134~194 electrically coupled in parallel may output HVDC voltage VIN respectively to supply power for different circuits or devices in the latter stages.

In the present embodiments, the leakage current detecting elements 132~192 may detect a first current I1 flowing out from the corresponding output terminals 134~194 and a second current I2 flowing in to the corresponding output terminal 134~194, and output the current detecting signals LD1~LD4 according to the first current I1 and the second current I2.

Specifically, in some embodiments, the leakage current detecting elements 132~192 may be implemented by various current sensing components applying Hall Effect. For better understanding, the output branch 130 is taken as an example for explanation in the following paragraphs.

Under the normal power supply situation, no leakage current is generated in the output branch 130, and the first current I1 flowing out from the positive power line VBUS+ via the output terminal 134 and the second current I2 flowing via the output terminal 134 to the negative power line 144 are approximately equal in magnitude and opposite in direction. When the current I1 and I2 flow through the leakage current detecting elements 132, the current detecting signal LD1 outputted by the leakage current detecting elements 132 is about zero.

On the other hand, when a grounding fault occurred in the output branch 130, the magnitude of the current I1 and I2 are different, and a differential current flows through the leakage current detecting elements 132, causing the leakage current detecting elements 132 outputs the non-zero current detecting signal LD1 according to the magnitude of the differential current (i.e., the magnitude of the leakage current).

Therefore, the processing circuit 140 may determine in which one of the output branches 130~190 the grounding fault occurred and the level of the leakage current according to the current detecting signal LD1~LD4, and output the corresponding warning signal. For example, when the current detecting signal LD1 is larger than a first predetermined value, the processing circuit 140 may output a first warning signal to notify the user to check the source of the failure to clear the fault, and when the current detecting signal LD1 is larger than a second predetermined value, the processing circuit 140 may output a second warning signal to warn the user that the leakage rises to a serious level and the maintenance shall be executed after the power is shutdown.

Figure 3:
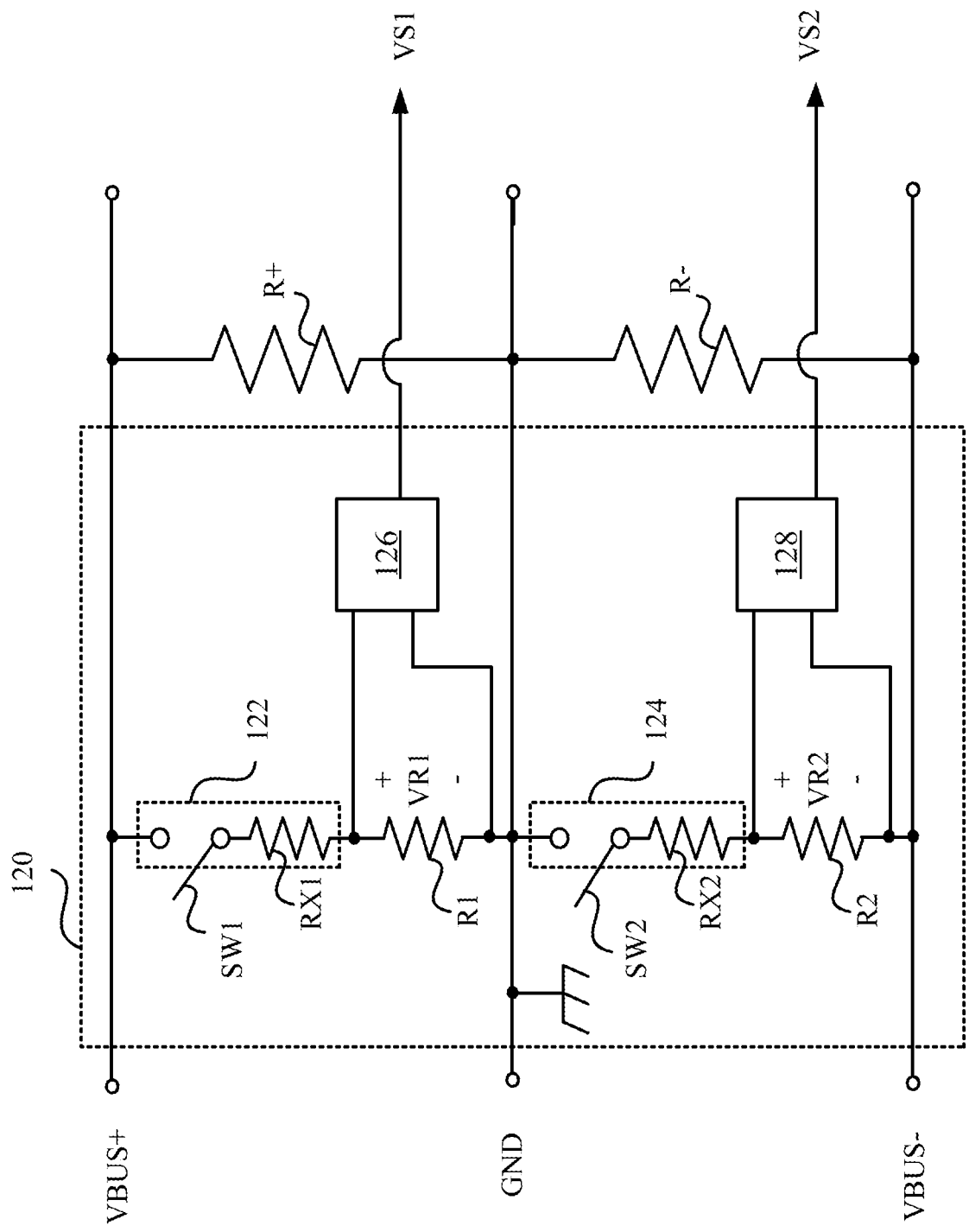
FIG. 3 is a diagram illustrating an insulation fault detection circuit according to an embodiment of the present disclosure.

Reference is made in accompanied with FIG. 3. FIG. 3 is a diagram illustrating the insulation fault detection circuit 120 according to an embodiment of the present disclosure. The insulation fault detection circuit 120 illustrated in the FIG. 3 may be applied in the power distribution unit 100 shown in FIG. 1 or FIG. 2. For better understanding, the specific operation of the insulation fault detection circuit 120 will be explained in accompanied with the embodiment shown in FIG. 2 in the following paragraphs, but the present disclosure is not limited thereto.

As shown in FIG. 2, the insulation fault detection circuit 120 is electrically coupled to the processing circuit 140, the positive power line VBUS+ and the negative power line VBUS−. The insulation fault detection circuit 120 is configured to output the voltage signals VS1 and VS2 corresponding to the insulation resistance value of the power distribution unit 100, and the processing circuit 140 receives the voltage signals VS1 and VS2 correspondingly and determines the insulation resistance value according to the voltage signals VS1 and VS2.

As shown in FIG. 3, in some embodiments, the insulation fault detection circuit 120 includes switching elements 122 and 124, the resistors R1 and R2 and voltage detecting elements 126 and 128. In structural, the resistor R1 is electrically coupled between the positive power line VBUS+ and the ground terminal GND via the switching element 122, and the resistor R2 is electrically coupled between the negative power line VBUS− and the ground terminal GND via the switching element 124.

The voltage detecting element 126 is electrically coupled to the two terminals of the resistor R1 and configured to measure the voltage VR1 across the resistor R1 and output the voltage signal VS1 accordingly. The voltage detecting element 128 is electrically coupled to the two terminals of the resistor R2 and configured to measure the voltage VR2 across the resistor R2 and output the voltage signal VS2 accordingly.

Specifically, in the present embodiment, the insulation fault detection circuit 120 is configured to measure the insulation resistance value R+ between the positive power line VBUS+ and the ground terminal GND, or the insulation resistance value R− between the negative power line VBUS− and the ground terminal GND, in accompany with the operation of the processing circuit 140. When the insulation resistance values R+ and R− vary, the current flowing through the resistors R1 and R2 vary accordingly, and thus the voltage VR1 and VR2 across the resistor R1 and R2 are changed. Alternatively stated, the magnitudes of the voltage signals VS1 and VS2 outputted by the voltage detecting elements 126 and 128 correspond to the values of the insulation resistance values R+ and R−.

The processing circuit 140 may output corresponding signal to control the on state and the off state of the switching elements 122 and 124. When the switching element 122 is on and the switching element 124 is off, the voltage detecting elements 126 and 128 in the insulation fault detection circuit 120 output the measured voltage signal VS1 and VS2 at the time to the processing circuit 140. Next, similarly, when the switching element 124 is on and the switching element 122 is off, the voltage detecting elements 126 and 128 in the insulation fault detection circuit 120 output the measured voltage signal VS1 and VS2 at the time to the processing circuit 140.

As illustrated in FIG. 3, in some embodiments, the switching element 122 includes a switch SW1 and a resistor RX1 connected in series, and the switching element 124 includes a switch SW2 and a resistor RX2 connected in series. The processing circuit 140 may calculate the insulation resistance values R+ and R− according to the voltage signals VS1 and VS2, in which the voltage signals VS1 and VS2 correspond to the voltage VR1 and VR2. Specifically, in some embodiments, the conversion between the voltage signals VS1, VS2 and the insulation resistance values R+ and R− is related to the ratio of the resistor RX1 and R1, and the ratio of the resistor RX2 and R2, and the processing circuit 140 may perform the calculation accordingly.

Thus, by switching the switches SW1 and SW2 to be on or off, the processing circuit 140 may calculate the insulation resistance values R+ and R− according to the variation of the voltage signals VS1 and VS2 during the two different combination states of the switch SW1 to be on, and the switch SW2 to be on respectively, and further determine whether leakage current occurred or other abnormal situations happened in the power distribution unit 100.

In some embodiments, the processing circuit 140 may first determine whether the leakage current occurred according to the voltage signals VS1 and VS2, and then determine the leakage current occurred in which one of the multiple output branches according to the current detecting signals LD1~LD4. For example, the processing circuit 140 may determine the location and the level of the leakage according to the current detecting signals LD1~LD4 when the calculated insulation resistance values R+ and R− are lower than a safety threshold value, and output different warning signals accordingly.

Figure 4:
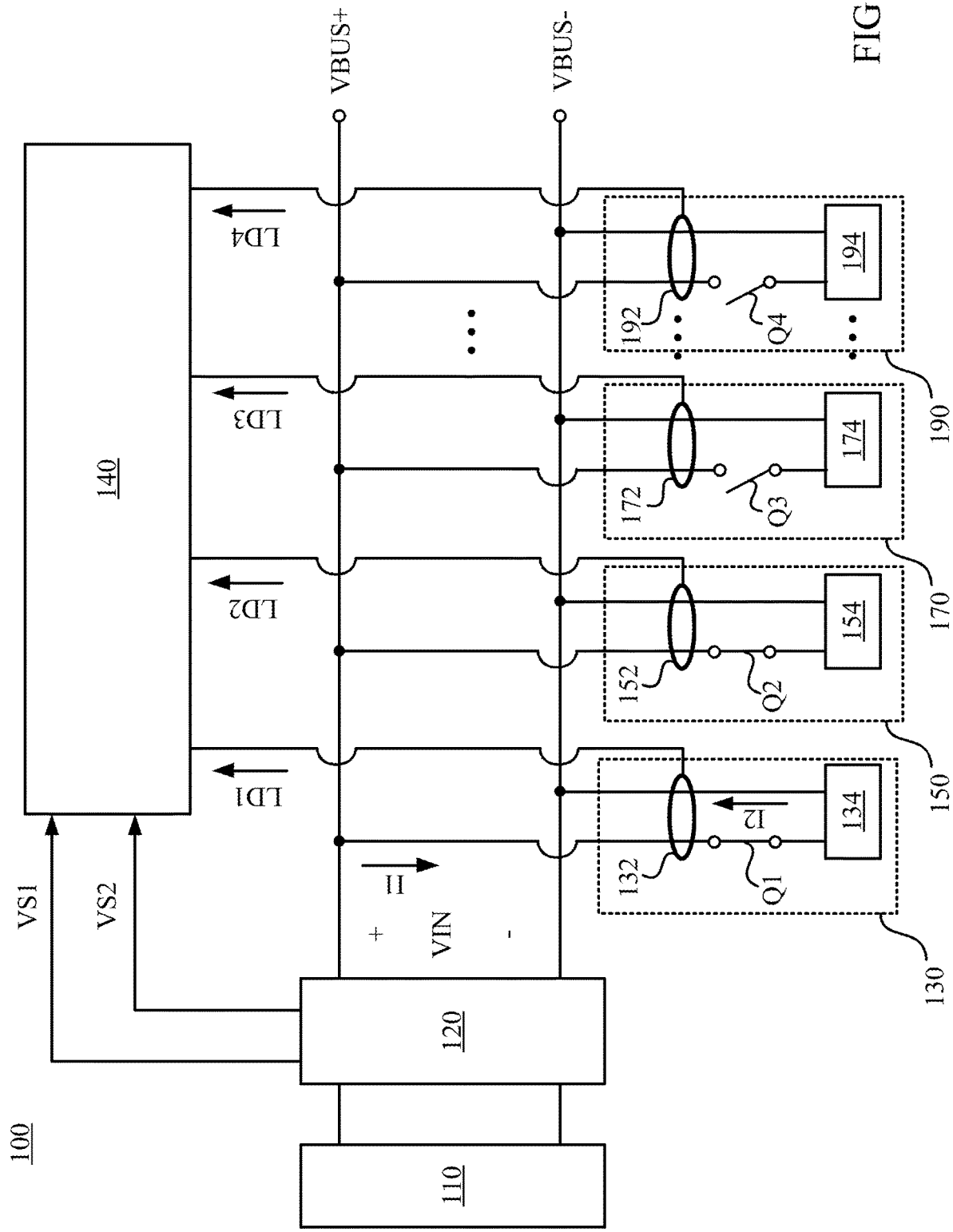
FIG. 4 is a diagram illustrating the power distribution unit according to another embodiment of the present disclosure.

Reference is made to FIG. 4. FIG. 4 is a diagram illustrating the power distribution unit 100 according to another embodiment of the present disclosure. The power distribution unit 100 illustrated in FIG. 4 is a smart power distribution unit (smart PDU). Compared to the power distribution unit 100 illustrated in FIG. 2, in the present embodiment, the output branches 130~190 further include corresponding output switches Q1~Q4.

The output switches Q1~Q4 are electrically coupled between the corresponding output terminals 134~194 and the positive power line VBUS+ respectively, but the present disclosure is not limited thereto. In some embodiments, the output switches Q1~Q4 are electrically coupled between the corresponding output terminals 134~194 and the negative power line VBUS−.

The output switches Q1~Q4 are configured to be selectively off according to the corresponding warning signals, such that the corresponding output terminals 134~194 stop outputting the HVDC voltage VIN. Specifically, the processing circuit 140 may output control signals respectively according to the warning signals to control the output switches Q1~Q4 to be on or off. Thus, when the processing circuit 140 determines the leakage occurred in one of the output branches 130~190, the processing circuit 140 may selectively turn off the output switches Q1~Q4 in the one of the output branches 130~190 to avoid the leakage getting worse and to keep other output branches in the power distribution unit 100 operate normally.

It is noted that, as stated in the above paragraphs, in the smart power distribution unit 100, the operation of the processing circuit 140 outputs control signals to turn off corresponding output switches Q1~Q4 such that the corresponding output terminals 134~194 stop outputting HVDC voltage VIN may be achieved in various ways such as remote end users sending commands via the communication module to control the processing circuit 140, or processing circuit 140 sending commands automatically according to the current detecting signals LD1~LD4. In some embodiments, the processing circuit 140 may further be configured, according to different levels of the leakage current, to perform the shutdown by the remote end user manually or to perform the shutdown protection by switching to the automatic operation.

Figure 5:
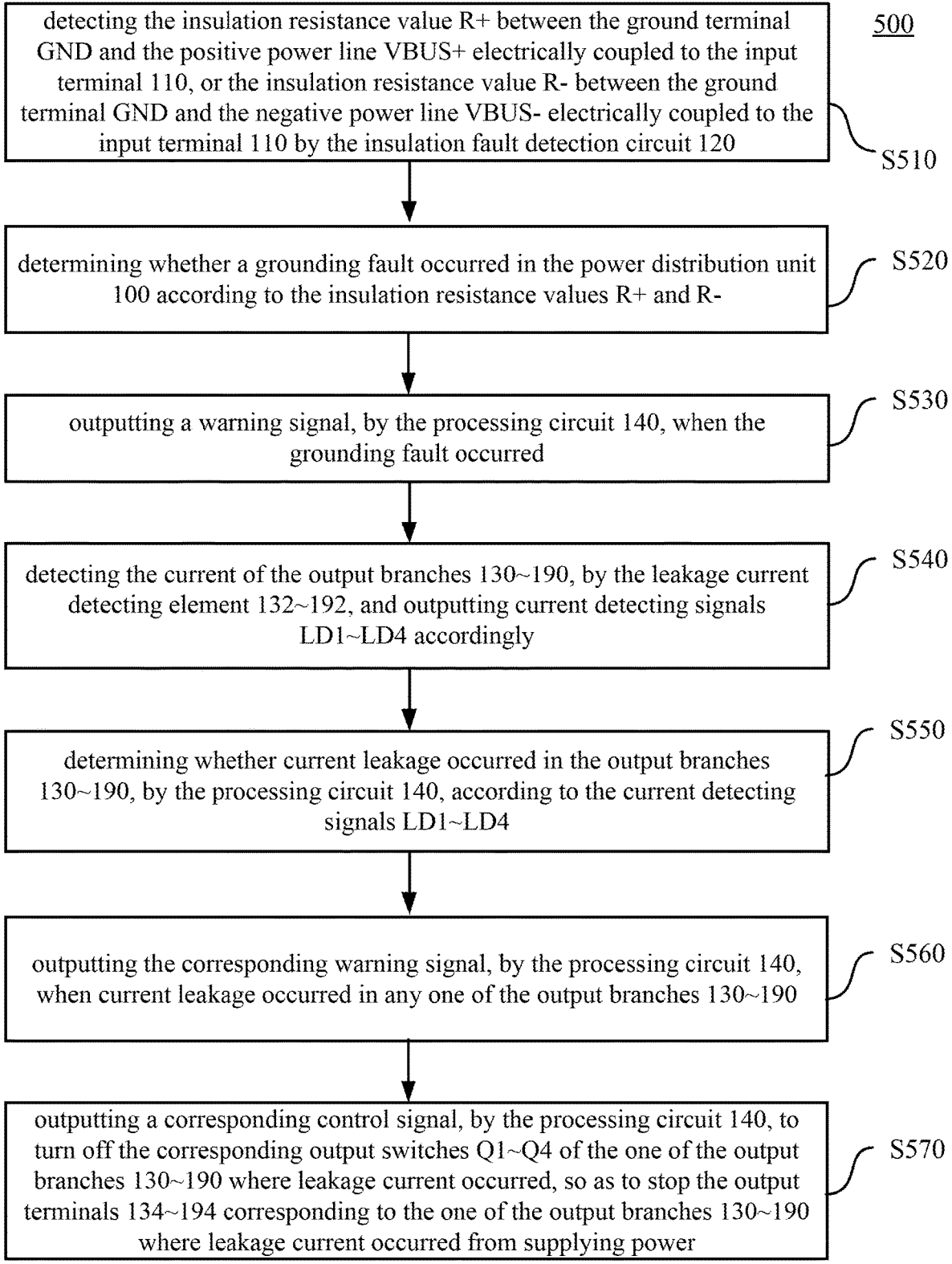
FIG. 5 is a flowchart illustrating a fault detecting method according to an embodiment of the present disclosure.

Reference is made to FIG. 5. FIG. 5 is a flowchart illustrating a fault detecting method 500 according to an embodiment of the present disclosure. In some embodiments, the fault detecting method 500 may be applied in the power distribution unit 100. The fault detecting method 500 includes steps S510~S530, which will be described and explained below. For better understanding of the present disclosure, the fault detecting method 500 is discussed in relation to the embodiments shown in FIG. 1~FIG. 4, but is not limited thereto. It will be apparent to those skilled in the art that various modifications and variations can be made without departing from the scope or spirit of the disclosure.

First, in step S510, the insulation resistance value R+ between the ground terminal GND and the positive power line VBUS+ electrically coupled to the input terminal 110, or the insulation resistance value R− between the ground terminal GND and the negative power line VBUS− electrically coupled to the input terminal 110 are detected by the insulation fault detection circuit 120.

Next, in step S520, whether a grounding fault occurred in the power distribution unit 100 is determined according to the insulation resistance values R+ and R−.

At last, a warning signal is outputted, by the processing circuit 140, when the grounding fault occurred.

In some embodiments, the fault detecting method 500 includes steps S540~S560. When the grounding fault occurred, the fault detecting method 500 may further execute steps S540~S560.

First, in step S540, the current of the output branches 130~190 are detected, by the leakage current detecting element 132~192, and current detecting signals LD1~LD4 are outputted accordingly. Next, in the step S550, whether current leakage occurred in the output branches 130~190 is determined, by the processing circuit 140, according to the current detecting signals LD1~LD4. At last, in step S560, the corresponding warning signal is outputted, by the processing circuit 140, when current leakage occurred in any one of the output branches 130~190.

In some embodiments, the fault detecting method 500 further includes steps S570. In the step S570, a corresponding control signal is outputted, by the processing circuit 140, to turn off the corresponding output switch (i.e., one of the output switches Q1~Q4) of the one of the output branches 130~190 where leakage current occurred, so as to stop the output terminal (i.e., one of the output terminals 134~194) corresponding to the one of the output branches 130~190 where leakage current occurred from supplying power.

For example, in some embodiments, when leakage current occurred in the output branch 130, the processing circuit 140 may output control signal to turn off the output switch Q1 corresponding to the output branch 130, such that the output terminal 134 corresponding to the output branch 130 stops supplying power.

In addition, in some embodiments, when leakage current occurred in any one of the output branches 130~190, the processing circuit may also output the control signal to turn off the output switches Q1~Q4 in all the output branches 130~190 at the same time such that the output terminals 134~194 stop supplying power at the same time.

It is noted that in some embodiments, the step of detecting the insulation resistance values R+ and R− includes outputting the voltage signal VS1 and the voltage signal VS2 corresponding to the insulation resistance values R+ and R− by the insulation fault detection circuit 120, and determining the insulation resistance values R+ and R− according to the voltage signal VS1 and the voltage signal VS2 by the processing circuit 140.

In some embodiments, the step of detecting the insulation resistance values R+ and R− further includes controlling, by the processing circuit 140, the switching element 122 of the insulation fault detection circuit 120 to be on outputting, by the insulation fault detection circuit 120, the voltage signal VS1 and the voltage signal VS2 when the switching element 122 is on; controlling, by the processing circuit 40, the switching element 124 of the insulation fault detection circuit 120 to be on; and outputting, by the insulation fault detection circuit 120, the voltage signal VS1 and the voltage signal VS2 when the switching element 124 is on.

In the present disclosure, by applying the steps mentioned above, whether leakage current occurred in the power distribution unit 100 may be detected, and warning signals may be outputted or corresponding control may be performed to reduce the damage caused by the leakage current.

Those skilled in the art can immediately understand how to perform the operations and functions of the method 500 based on the power distribution unit 100 in the various embodiments described above, and thus a further explanation is omitted herein for the sake of brevity.

The above description includes exemplary operations, but the operations are not necessarily performed in the order described. The order of the operations disclosed in the present disclosure may be changed, or the operations may even be executed simultaneously or partially simultaneously as appropriate, in accordance with the spirit and scope of various embodiments of the present disclosure.

In addition, in the above embodiments, the processing circuit 140 may be implemented by micro controller unit (MCU), Complex Programmable Logic Device (CPLD), Field-programmable gate array (FPGA), etc., and the voltage detecting elements 126 and 128 and the leakage current detecting elements 132~192 may be implemented by various voltage and current sensing components. The output switches Q1~Q4, the switches SW1, SW2, and the resistors R1, R2, RX1, and RX2 may be implemented by proper power electronic components.

In summary, in the present disclosure, by applying the embodiments described above, users may be prevented from unknowingly touching the housing of the power distribution unit where the leakage current occurred and thus the safety of the HVDC power distribution unit may be improved by arranging the insulation fault detection circuit and the leakage current detecting elements to detect the leakage situation of the power distribution unit and outputting the corresponding warning signal by the processing circuit.

Although the disclosure has been described in considerable detail with reference to certain embodiments thereof, it will be understood that the embodiments are not intended to limit the disclosure. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A power distribution unit, comprising:
   an input terminal, electrically coupled to a positive power line and a negative power line, and configured to receive a direct current (DC) voltage;
   an insulation fault detection circuit, configured to detect an insulation resistance value between the positive power line and a ground terminal, or between the negative power line and the ground terminal;
   a first output branch, comprising:
      a first output terminal, configured to provide the DC voltage to a first device through the positive and negative power lines on the condition that the first device is connected to the first output terminal; and
      a first leakage current detecting element, configured to detect a first current flowing out from the first output terminal and a second current flowing into the first output terminal at the same time, and generate a first current detecting signal according to the first current and the second current;
   a second output branch, comprising:
      a second output terminal, configured to provide the DC voltage to a second device different from the first device through the positive and negative power lines on the condition that the second device is connected to the second output terminal; and
      a second leakage current detecting element, configured to detect a third current flowing out from the second output terminal and a fourth current flowing into the second output terminal at the same time, and generate a second current detecting signal according to the third current and the fourth current; and
   a processing circuit, configured to determine whether a grounding fault is occurred according to the detected insulation resistance value, and in response to the grounding fault being occurred, the processing circuit further configured to determine which of the first and second output branches have a leakage current according to the first and second current detecting signals and stop providing the DC voltage to the device to which the output branch having the leakage current is connected.

2. The power distribution unit of claim 1, wherein the first output branch further comprises a first output switch electrically coupled between the positive power line and the first output terminal, and the second output branch further comprises a second output switch electrically coupled between the positive power line and the second output terminal,
   wherein in response to the grounding fault being occurred, the processing circuit is further configured to output a control signal to turn off the corresponding one of the first and the second output switches such that the corresponding one of the first and the second output terminals stops outputting the DC voltage.

3. The power distribution unit of claim 1, wherein the insulation fault detection circuit is configured to output a first voltage signal and a second voltage signal corresponding to the insulation resistance value, and the processing circuit is configured to determine the insulation resistance value according to the first voltage signal and the second voltage signal.

4. The power distribution unit of claim 3, wherein the insulation fault detection circuit comprises:
   a first switching element;
   a second switching element;
   a first resistor, electrically coupled to the positive power line and the ground terminal via the first switching element;
   a second resistor, electrically coupled to the negative power line and the ground terminal via the second switching element;
   a first voltage detecting element configured to measure the voltage across the first resistor and output the first voltage signal accordingly; and
   a second voltage detecting element configured to measure the voltage across the second resistor and output the second voltage signal accordingly.

5. The power distribution unit of claim 4, wherein the processing circuit is further configured to control the first switching element and the second switching element to be on or off, and calculate the insulation resistance value according to the value of the first voltage signal and of the second voltage signal measured when the first switching element is on and the second switching element is off, and measured when the first switching element is off and the second switching element is on.

6. The power distribution unit of claim 4, wherein the first switching element comprises a first switch and a third resistor electrically coupled in series, and the second switching element comprises a second switch and a fourth resistor electrically coupled in series.

7. The power distribution unit of claim 1, wherein the processing circuit is further configured to determine that the grounding fault is occurred when the detected insulation resistance value is lower than a safety threshold value.

8. A power distribution unit, comprising:
an input terminal configured to receive a direct current (DC) voltage, wherein the input terminal comprises:
a positive node electrically coupled to a positive power line; and
a negative node electrically coupled to a negative power line;
an insulation fault detection circuit, configured to detect an insulation resistance value between the positive power line and a ground terminal, or between the negative power line and the ground terminal;
a first output branch, comprising:
a first output terminal, configured to provide the DC voltage to a first device through the positive and negative power lines on the condition that the first device is connected to the first output terminal; and
a first leakage current detecting element, configured to detect a first current flowing out from the first output terminal and a second current flowing into the first output terminal at the same time, and generate a first current detecting signal according to the first current and the second current;
a second output branch, comprising:
a second output terminal, configured to provide the DC voltage to a second device different from the first device through the positive and negative power lines on the condition that the second device is connected to the second output terminal; and
a second leakage current detecting element, configured to detect a third current flowing out from the second output terminal and a fourth current flowing into the second output terminal at the same time, and generate a second current detecting signal according to the third current and the fourth current; and
a processing circuit configured to determine whether a grounding fault is occurred according to the detected insulation resistance value, and in response to the grounding fault being occurred, the processing circuit further configured to determine which of the first and second output branches have a leakage current according to the first and second current detecting signals and stop providing the DC voltage to the device to which the output branch having the leakage current is connected.

9. The power distribution unit of claim 8, wherein the first output branch further comprises a first output switch electrically coupled between the positive power line and the first output terminal, and the second output branch further comprises a second output switch electrically coupled between the positive power line and the second output terminal,
wherein in response to the grounding fault being occurred, the processing circuit is further configured to output a control signal to turn off the corresponding one of the first and the second output switches such that the corresponding one of the first and the second output terminals stops outputting the DC voltage.

10. The power distribution unit of claim 8, wherein the insulation fault detection circuit is further configured to output a first voltage signal and a second voltage signal corresponding to the insulation resistance value, and the processing circuit is further configured to determine the insulation resistance value according to the first voltage signal and the second voltage signal.

11. The power distribution unit of claim 8, wherein the processing circuit is further configured to determine that the grounding fault is occurred when the detected insulation resistance value is lower than a safety threshold value.

12. A fault detecting method applied in a power distribution unit, wherein the power distribution unit comprises an input terminal, an insulation fault detection circuit, a processing circuit, a first output branch and a second output branch, wherein the input terminal, electrically coupled to a positive power line and a negative power line and configured to receive a direct current (DC) voltage, the first output branch comprises an first output terminal and a first leakage current detecting element and the second output branch comprises an second output terminal and a second leakage current detecting element, and the fault detecting method comprises:
providing the DC voltage to a first device through the positive and negative power lines on the condition that the first device is connected to the first output terminal;
providing the DC voltage to a second device different from the first device through the positive and negative power lines on the condition that the second device is connected to the second output terminal;
detecting, by the insulation fault detection circuit, an insulation resistance value between a ground terminal and the positive power line, or between the ground terminal and the negative power line;
detecting, by the first leakage current detecting element, a first current flowing out from the first output terminal and a second current flowing into the first output terminal at the same time;
outputting, by the first leakage current detecting element, a first current detecting signal according to the first current and the second current;
detecting, by the second leakage current detecting element, a third current flowing out from the second output terminal and a fourth current flowing into the second output terminal at the same time;
outputting, by the second leakage current detecting element, a second current detecting signal according to the third current and the fourth current;
determining, by the processing circuit, whether a grounding fault is occurred according to the detected insulation resistance value;
determining, by the processing circuit, which of the first and second output branches have a leakage current according to the first and second current detecting signals in response to the grounding fault being occurred; and
stopping providing, by the processing circuit, the DC voltage to the device to which the output branch having the leakage current is connected.

13. The fault detecting method of claim 12, wherein detecting the insulation resistance value comprises:
outputting, by the insulation fault detection circuit, a first voltage signal and a second voltage signal corresponding to the insulation resistance value; and
determining, by the processing circuit, the insulation resistance value according to the first voltage signal and the second voltage signal.

14. The fault detecting method of claim 13, wherein detecting the insulation resistance value further comprises:
controlling, by the processing circuit, a first switching element of the insulation fault detection circuit to be on;
outputting, by the insulation fault detection circuit, the first voltage signal and the second voltage signal when the first switching element is on;
controlling, by the processing circuit, a second switching element of the insulation fault detection circuit to be on; and outputting, by the insulation fault detection circuit, the first voltage signal and the second voltage signal when the second switching element is on.

15. The fault detecting method of claim 12, wherein the processing circuit determines that the grounding fault is occurred when the insulation resistance value is lower than a safety threshold value.

16. The fault detecting method of claim 12, wherein the first output branch further comprises a first output switch and the second output branch further comprises a second output switch, and the fault detecting method further comprises:

outputting, by the processing circuit, a control signal to turn off the corresponding one of the first and the second output switches in response to the grounding fault being occurred, so as to stop the corresponding one of the first and the second output terminals to output the DC voltage.

* * * * *